United States Patent
Chen

(10) Patent No.: US 7,485,523 B2
(45) Date of Patent: Feb. 3, 2009

(54) METHOD FOR FORMING HIGH VOLTAGE DEVICE AND SEMICONDUCTOR DEVICE

(75) Inventor: Anchor Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 456 days.

(21) Appl. No.: 11/164,949

(22) Filed: Dec. 12, 2005

(65) Prior Publication Data

US 2006/0240628 A1    Oct. 26, 2006

Related U.S. Application Data

(60) Provisional application No. 60/635,819, filed on Dec. 13, 2004.

(51) Int. Cl.
*H01L 21/8238* (2006.01)
(52) U.S. Cl. ............. 438/200; 438/220; 257/E21.642
(58) Field of Classification Search ............... 438/200, 438/220, 229, 230, 232; 257/E21.642
See application file for complete search history.

(56) References Cited

U.S. PATENT DOCUMENTS

| | | | | |
|---|---|---|---|---|
| 6,096,610 A | * | 8/2000 | Alavi et al. | 438/286 |
| 6,420,769 B2 | * | 7/2002 | Patelmo et al. | 257/500 |
| 6,451,655 B1 | * | 9/2002 | Leonardi | 438/268 |

* cited by examiner

*Primary Examiner*—Chandra Chaudhari
(74) *Attorney, Agent, or Firm*—Jianq Chyun IP Office

(57) ABSTRACT

The invention is directed to a method for manufacturing a high voltage device. The method comprises steps of providing a substrate and then forming a first doped region having a first conductive type in the substrate. At least two second doped regions having a second conductive type are formed in the substrate, wherein the second doped regions are located adjacent to both sides of the first doped region respectively, and the first doped region is separated from the second doped regions with an isolation region. A gate structure is formed on the substrate between the second doped regions and a source/drain region having the second doped region is formed in the substrate adjacent to both sides of the gate structure.

19 Claims, 6 Drawing Sheets

METHOD FOR FORMING HIGH VOLTAGE DEVICE AND SEMICONDUCTOR DEVICE

CROSS-REFERENCE TO RELATED APPLICATION

This application claims the priority benefit of U.S.A. provisional application Ser. No. 60/635,819, filed on Dec. 13, 2004. All disclosures are incorporated therewith.

BACKGROUND OF THE INVENTION

1. Field of Invention

The present invention relates to a semiconductor device and a method for forming the same. More particularly, the present invention relates to a high voltage device and a method for forming the same.

2. Description of Related Art

High voltage device, as implied by the name, is a device can be operated at relatively high voltage bias. That is, the breakdown voltage of the high voltage device is higher than that of the general device. Typically, in the high voltage device, the isolation layer is used to increase the distance between the source/drain region and the gate electrode or the lightly dopping ion dopping process is performed on drift region under the isolation layer and the grade region under the source/drain region so as to increase the junction breakdown voltage. Hence, under the high voltage, the high voltage device can be operated normally.

FIG. 1A is a cross-sectional view showing a conventional high voltage device. A high voltage device is located on the substrate 100. First, a polysilicon gate structure 103 is formed, and then a double diffused drain (DDD) structure 104 is formed in the substrate 100. The DDD structure 104 comprises a source/drain region 104a and a grade region 104b. The grade region 104b is used to alleviate the hot electron effect to enhance the breakdown voltage of the source/drain region 104a.

FIG. 1B is a cross-sectional view showing another conventional high voltage device. In FIG. 1B, he elements are labeled with the reference number as same as that used to label the same elements shown in FIG. 1B. Among the high voltage devices shown in FIG. 1B, an isolation structure 106 is located between the gate structure 103 and the source/drain region 104a. Under the isolation structure 106, there is a drift region 108. The isolation structure 106 and the drift region 108 are used to alleviate the hot electron effect so as to increase the breakdown voltage of the source/drain region 104a.

SUMMARY OF THE INVENTION

Accordingly, at least one objective of the present invention is to provide a method for manufacturing a high voltage device capable of decreasing the manufacturing cost.

At least another objective of the present invention is to provide a high voltage device capable of providing different specifications of the high voltage devices.

To achieve these and other advantages and in accordance with the purpose of the invention, as embodied and broadly described herein, the invention provides a method for manufacturing a high voltage device. The method comprises steps of providing a substrate and then forming a first doped region having a first conductive type in the substrate. At least two second doped regions having a second conductive type are formed in the substrate, wherein the second doped regions are located adjacent to both sides of the first doped region respectively, and the first doped region is separated from the second doped regions with an isolation region. A gate structure is formed on the substrate between the second doped regions and a source/drain region having the second doped region is formed in the substrate adjacent to both sides of the gate structure.

According to one embodiment of the present invention, a distance between the aforementioned first doped region and one of the aforementioned second doped regions is about 0.1-3 micrometers.

According to one embodiment of the present invention, a distance between the aforementioned first doped region and one of the aforementioned second doped regions is about 0.5 micrometers.

According to one embodiment of the present invention, the aforementioned steps of forming the first doped region and the second doped regions comprises steps of forming a first photoresist layer over the substrate. The first photoresist layer is exposed with a first mask, wherein the first mask possesses a first transparent region pattern. The first photoresist layer is developed so as to transform the first photoresist layer to be a patterned first photoresist layer. A first doping process is performed to form the first doped region by using the patterned first photoresist layer as a mask. The patterned first photoresist layer is removed. A second photoresist layer is formed over the substrate. The second photoresist layer is exposed with a second mask having a second transparent region pattern, wherein the second transparent region pattern is a reverse tone pattern of the first transparent region pattern. The second photoresist layer is developed so as to transform the second photoresist layer to be a patterned second photoresist layer. A second doping process is performed to form the second doped regions by using the patterned second photoresist layer as a mask. The patterned second photoresist layer is removed.

According to one embodiment of the present invention, the fringe of the aforementioned first transparent region pattern is inwardly shrunk with a first distance and the fringe of the aforementioned second transparent region pattern is inwardly shrunk with a second distance.

According to one embodiment of the present invention mentioned above, a plurality of isolation structures are further formed in the substrate and the gate structure is located between the isolation structures and the source/drain region is separated from the gate structure by the isolation structures.

According to one embodiment of the present invention, when the aforementioned fist conductive type is P type, the aforementioned second conductive type is N type.

According to one embodiment of the present invention, when the aforementioned fist conductive type is N type, the aforementioned second conductive type is P type.

The present invention also provides a high voltage device. The high voltage device comprises several isolation structures, a first doped region, at least two second doped regions, at least two isolation regions, a gate structure and a source/drain region. The isolation structures are located in a substrate. The first doped region has a first conductive type, wherein the first doped region is located in the substrate between the isolation structures. The second doped regions have a second conductive type, wherein the second doped regions are located adjacent to both sides of the first doped region respectively. The isolation regions are located in the substrate between the first doped region and the second doped regions. The gate structure is located on the substrate between the second doped regions. The source/drain region has the second conductive type, wherein the source/drain region is located in the substrate adjacent to both sides of the gate structure.

According to one embodiment of the present invention, a distance between the aforementioned first doped region and one of the second aforementioned doped regions is about 0.1-3 micrometers.

According to one embodiment of the present invention, a distance between the aforementioned first doped region and one of the aforementioned second doped regions is about 0.5 micrometers.

According to one embodiment of the present invention, the aforementioned gate structure is located on the substrate between the isolation structures and the source/drain region is separated from the gate structure by the isolation structures.

According to one embodiment of the present invention, when the aforementioned fist conductive type is P type, the aforementioned second conductive type is N type.

According to one embodiment of the present invention, when the aforementioned fist conductive type is N type, the second aforementioned conductive type is P type.

In high voltage device of the present invention, the doped regions mentioned above can be used to replace the grade region and drift region used in the conventional manufacturing process for the high voltage device. Further, the distance between the doped regions can be used to control the breakdown voltage of the source/drain region. Hence, manufacturing the devices respectively with different specifications respectively can be accomplished so as to full fill the requirements for manufacturing devices respectively with different breakdown voltages.

The present invention further provides a method for manufacturing a semiconductor device. The method comprises steps of providing a substrate, wherein the substrate is divided into a high voltage device region and a low voltage device region. A first well region having a first conductive type is formed in the low voltage device region and a first doped region having the first conductive type in the high voltage device region in the substrate. A second well region having a second conductive type is formed in the low voltage device region and at least two second doped regions having the second conductive type in the high voltage device region in the substrate, wherein the second well region and the first well region are adjacent to each other in the low voltage device region, second doped regions are located at both sides of the first doped region in the high voltage device region in the substrate and the first doped region and the second doped regions are separated from each other by an isolation region. A gate structure is formed on the substrate between the second doped regions in the high voltage device region. A first source/drain region having the second conductive type is formed in the substrate adjacent to both sides of the gate substrate.

According to one embodiment of the present invention, a distance between the aforementioned first doped region and one of the aforementioned second doped regions is about 0.1-3 micrometers.

According to one embodiment of the present invention, a distance between the aforementioned first doped region and one of the aforementioned second doped regions is about 0.5 micrometers.

According to one embodiment of the present invention, the aforementioned step of forming the first well region in the low voltage device region and the first doped region in the high voltage device region comprises steps of forming a first photoresist layer over the substrate and then exposing the first photoresist layer with a first mask, wherein the first mask possesses a first transparent region pattern. The first photoresist layer is developed so as to transform the first photoresist layer to be a patterned first photoresist layer. A first doping process is performed to form the first well region in the low voltage device region and the first doped region in the high voltage device region by using the patterned first photoresist layer as a mask. The patterned first photoresist layer is removed.

According to one embodiment of the present invention, the aforementioned step of forming the second well region in the low voltage device region and the second doped regions in the high voltage device region comprises steps of forming a second photoresist layer over the substrate. The second photoresist layer is exposed with a second mask having a second transparent region pattern, wherein the second transparent region pattern is a reverse tone pattern of the first transparent region pattern. The second photoresist layer is developed so as to transform the second photoresist layer to be a patterned second photoresist layer. A second doping process is performed to form the second well region in the low voltage device region and the second doped regions in the high voltage device region by using the patterned second photoresist layer as a mask. The patterned second photoresist layer is removed.

According to one embodiment of the present invention, the fringe of the first aforementioned transparent region pattern in the high voltage device region is inwardly shrunk with a first distance.

According to one embodiment of the present invention, the fringe of the aforementioned second transparent region pattern in the high voltage device region is inwardly shrunk with a second distance.

According to one embodiment of the present invention, a plurality of isolation structures are further formed in the substrate and, in the high voltage device region, the gate structure is located between the isolation structures and the source/drain region is separated from the gate structure by the isolation structures.

According to one embodiment of the present invention, when the aforementioned fist conductive type is P type, the aforementioned second conductive type is N type.

According to one embodiment of the present invention, when the aforementioned fist conductive type is N type, the second aforementioned conductive type is P type.

According to one embodiment of the present invention, the aforementioned method further comprises steps of forming a first gate structure on the first well region and then forming a second source/drain region having the second conductive type in the substrate adjacent to both sides of the first gate structure. A second gate structure is formed on the second well region and a third source/drain region having the first conductive type is formed in the substrate adjacent to both sides of the second gate structure.

In the method of the present invention, the doped regions at the high voltage device region and the well regions at the low voltage device region can be formed jointly. Therefore, the manufacturing cost and the cost for designing the mask can be saved. Furthermore, the time for manufacturing the high voltage device can be saved as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2A through 2E are cross-sectional views schematically illustrating a method for manufacturing a semiconductor device according to a preferred embodiment of the invention.

Figure 1A:
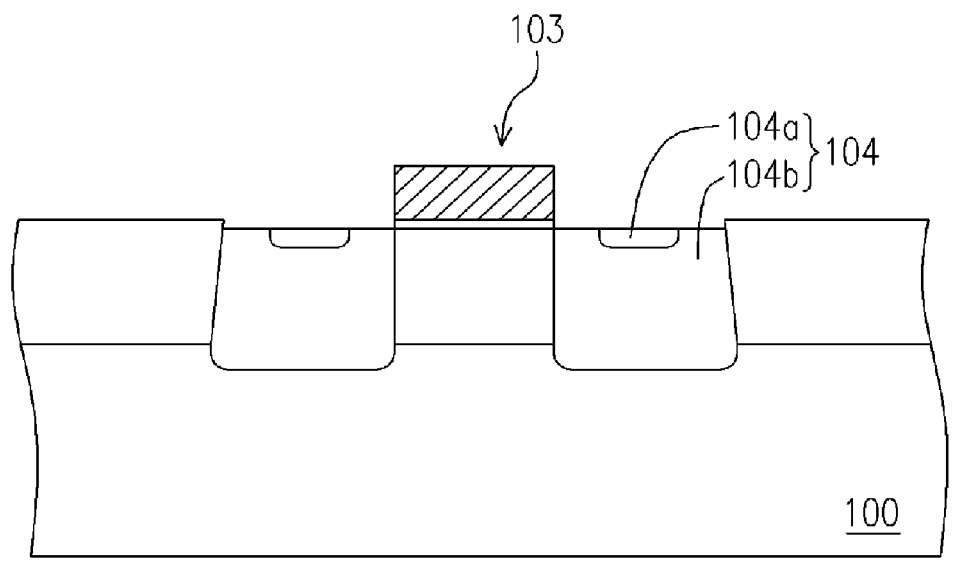
FIG. 1A is a cross-sectional view showing a conventional high voltage device.
Figure 1B:
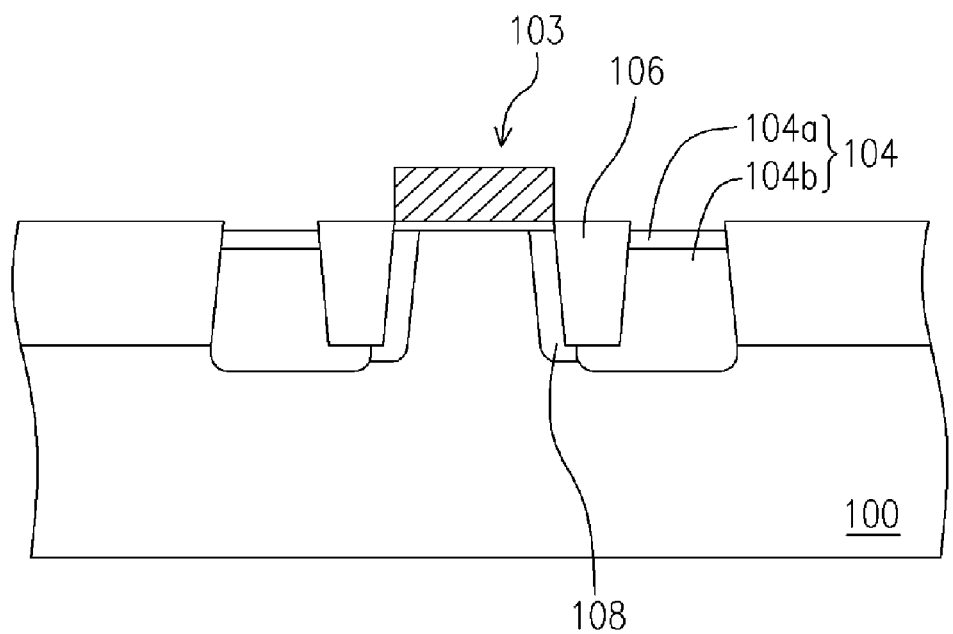
FIG. 1B is a cross-sectional view showing another conventional high voltage device.
Figure 2A:
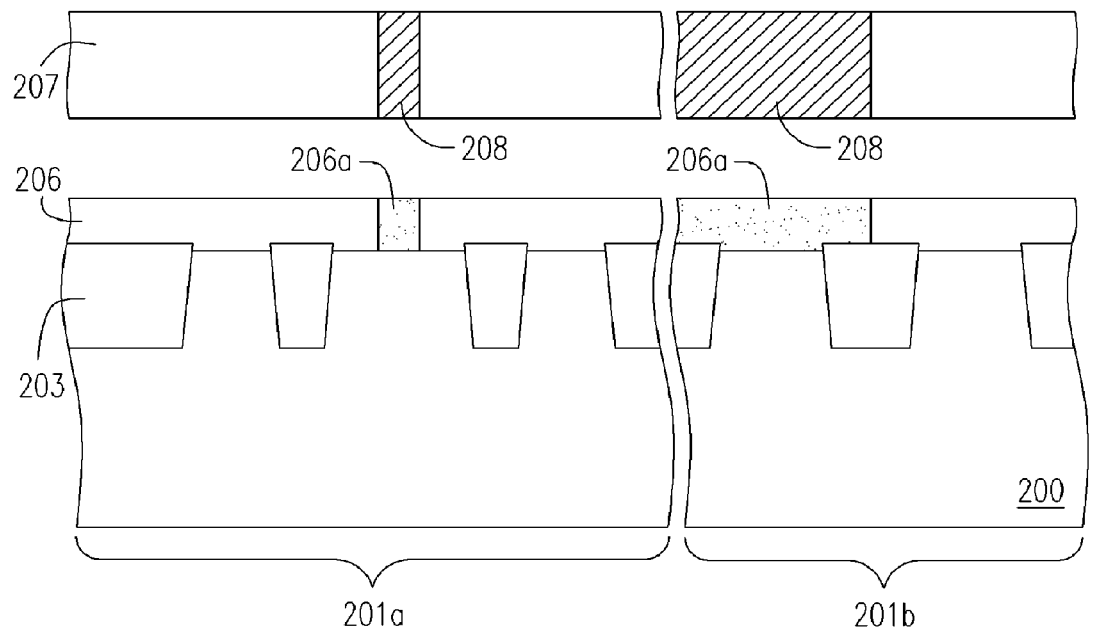
FIGS. 2A through 2E are cross-sectional views schematically illustrating a method for manufacturing a semiconductor device according to a preferred embodiment of the invention.

As shown in FIG. 2A, a substrate 200 is provided. The substrate 200 comprises a high voltage device region 201a and a low voltage device region 201b. Then, several isolation structures 203 are formed in the substrate 200. The method for forming the isolation structures 203 can be, for example but not limited to, a shallow trench isolation process. The isolation structures 203 can be, for example, made of silicon oxide. Thereafter, a photoresist layer 206 is formed over the substrate 200. The photoresist layer 206 can be, for example, made of a positive photoresist material. Further, an exposure process is performed on the photoresist layer 206 by using a mask 207 so as to form an exposed region 206a in the photoresist layer 206. In FIG. 2A, a transparent region pattern 208 in the mask 207 is marked as a twilled region.

Figure 2B:
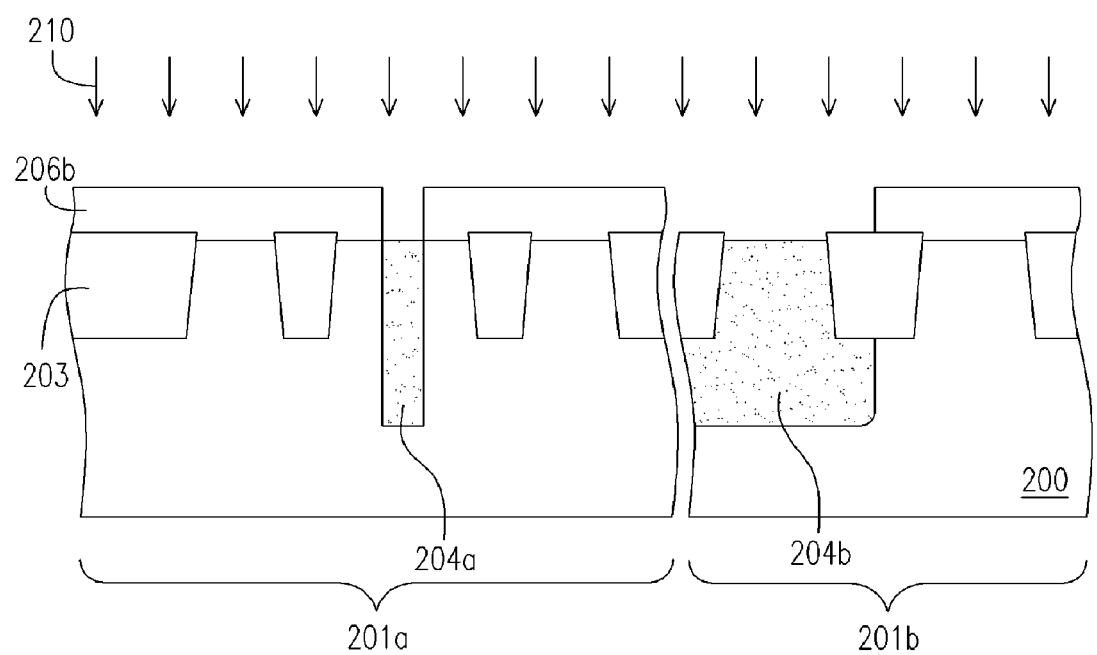

As shown in FIG. 2B, a development process is performed to remove the exposed region 206a of the photoresist layer 206 so as to transform the photoresist layer 206 to be a patterned photoresist layer 206b. Then, by using the patterned photoresist layer 206b as a mask, a doping process 210 is performed to form a doped region 204a and a well region 204b in the high voltage device region 201a and the low voltage device region 201b of the substrate 200 respectively. The conductive type of the doped region 204a and the well region 204b can be, for example, P type. The method for forming the doped region 204a and the well region 204b can be, for example but not limited to, an ion implantation process.

Figure 2C:
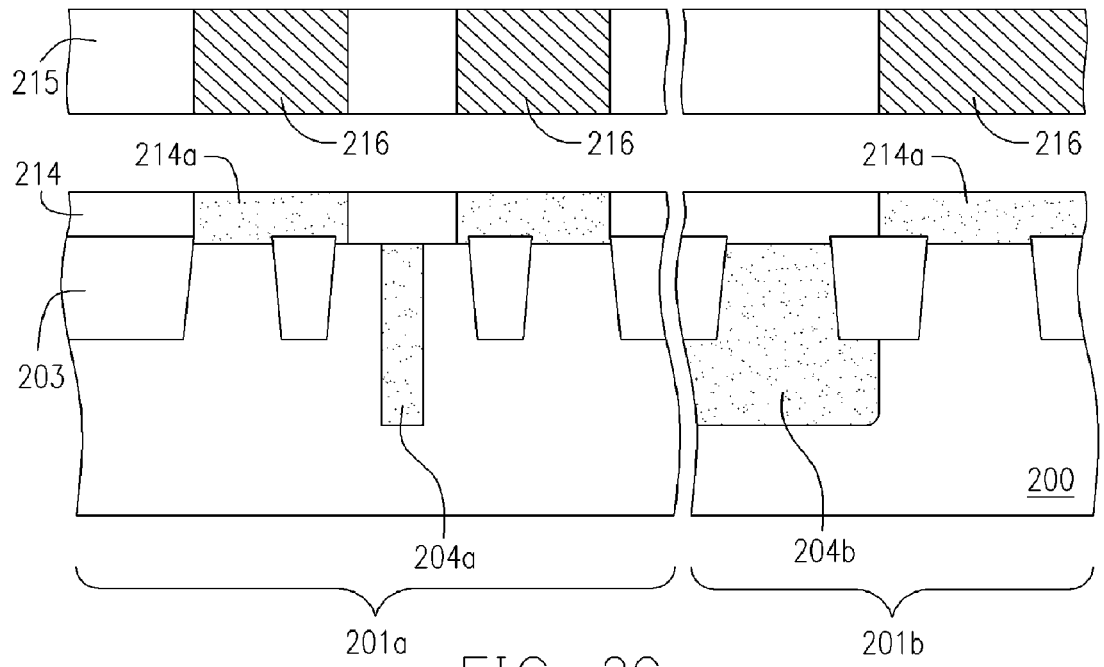

As shown in FIG. 2C, the patterned photoresist layer 206b is removed. The method for removing the patterned photoresist layer 206b comprises steps of performing an ashing process and performing a cleaning process with the use of an RCA solution. Then, a photoresist layer 214 is formed over the substrate 200. The photoresist layer 214 can be, for example but not limited to, made of a positive photoresist material. Furthermore, an exposure process is performed on the photoresist layer 214 by using a mask 215 so as to form an exposed region 214a in the photoresist layer 214. In FIG. 2C, a transparent region pattern 216 in the mask 215 is marked as a twilled region.

Figure 2D:
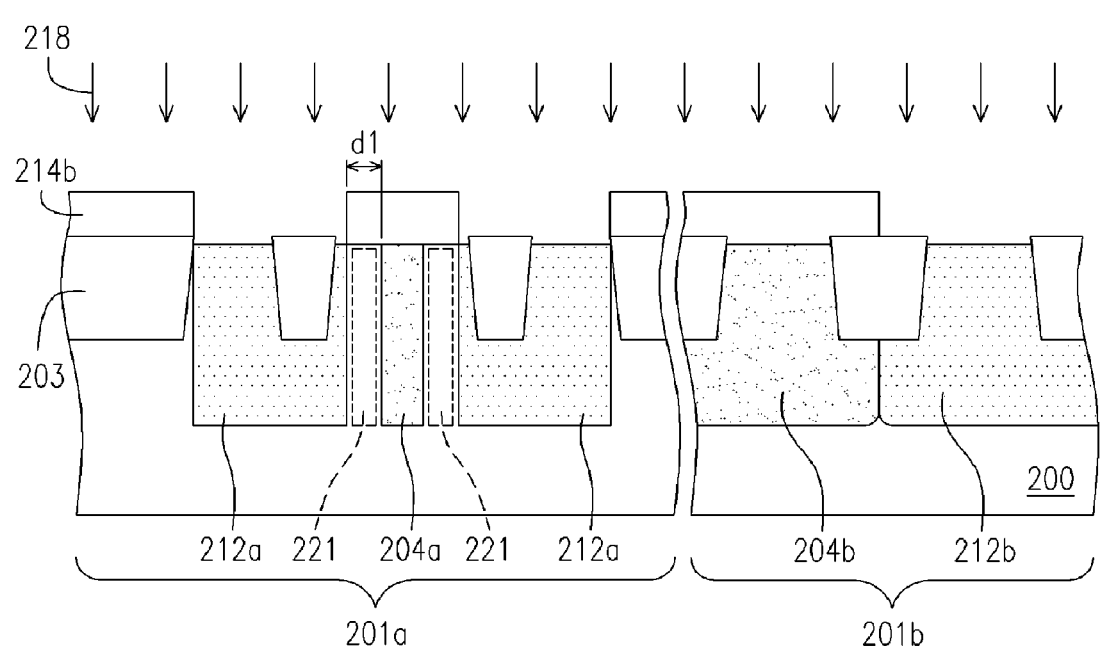

As shown in FIG. 2D, a development process is performed to remove the exposed region 214a of the photoresist layer 214 so as to transform the photoresist layer 214 to be a patterned photoresist layer 214b. Then, by using the patterned photoresist layer 214b as a mask, a doping process 218 is performed to form at least two doped regions 212a and a well region 212b in the high voltage device region 201a and the low voltage device region 201b of the substrate 200 respectively. In the high voltage device region 201a, the doped regions 212a are located adjacent to both sides of the doped region 204a in the substrate 200. The conductive type of the doped regions 212a and the well region 212b can be, for example, N type. Also, a portion of the substrate 200 between the doped region 204a and the doped regions 212a is an isolation region 221. The size of the isolation region 221, which can be represented by a distance d1 between the doped region 204a and one of the doped regions 212a, is about 0.1-3 micrometers. Preferably, the distance d1 is about 0.5 micrometers. In the present invention, the isolation region 221 is a region used to separate the doped region 204a from the doped regions 212a. The isolation region 221 can be, for example but not limited to, a portion of the substrate 200.

Figure 2E:
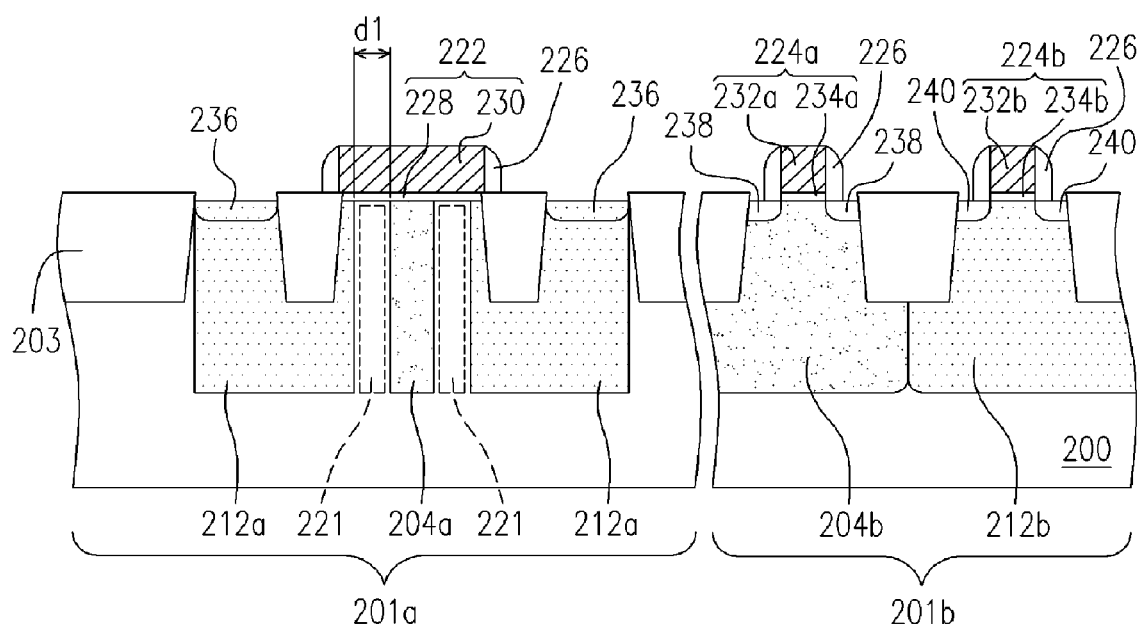

As shown in FIG. 2E, the patterned photoresist layer 214b is removed. The method for removing the patterned photoresist layer 214b comprises steps of performing an ashing process and performing a cleaning process with the use of an RCA solution. Then, in the high voltage device region 201a, a gate structure 222 is formed on the substrate 200 between the doped regions 212a. Meanwhile, in the low voltage device region 201b, a gate structure 224a and a gate structure 224b are formed on the well region 204b and the well region 212b respectively. The gate structure 222 comprises a gate dielectric layer 228 and a gate electrode 230. The gate structure 224a comprises a gate electrode 232a and a gate dielectric layer 234a. The gate structure 224b comprises a gate electrode 232b and a gate dielectric layer 234b.

The method for forming the gate structures 222, 224a and 224b comprises steps of forming a dielectric layer over the high voltage device region 201a of the substrate 200 and forming a dielectric layer over the low voltage device region 201b of the substrate 200. It should be noticed that the thickness values of the dielectric layers over the high voltage device region 201a and the low voltage device region 201b respectively are different from each other. The dielectric layers can be, for example but not limited to, made of silicon oxide. Further, a conductive layer is formed over the substrate 200 by using a chemical vapor deposition process. The conductive layer can be, for example but not limited to, made of doped polysilicon. Then, the conductive layer and the dielectric layers are patterned to form the gate structures 222, 224a and 224b. A spacer 226 can be also formed on the sidewalls of the gate structures 222, 224a and 224b according to the process requirements. The method for forming the spacer 226 comprises steps of forming a dielectric layer, such as a silicon nitride layer, by using the chemical vapor deposition process and then performing an anisotropic etching process to remove a portion of the dielectric layer.

A source/drain region 236 is formed in the doped regions 212a adjacent to both sides of the gate structure 222. Meanwhile, a source/drain region 238 is formed in the well region 204b adjacent to both sides of the gate structure 224a. Then, a source/drain region 240 is formed in the well region 212b adjacent to both sides of the gate structure 224b. The formation order of the source/drain regions 236, 238, and 240 are not limited by the description mentioned above. The method for forming the source/drain regions 236, 238, and 240 is similar to the method for forming the source/drain region of the complementary-metal-oxide semiconductor device and is not further described herein.

Hereafter, the mask 207 and mask 215 used in the manufacturing process mentioned above is detailed described. Generally, in the conventional process for forming the complementary-metal-oxide semiconductor device, the transparent region patterns on the masks for forming the P type well region and the N type well region respectively are reverse tone to each other. That is, pattern in the patterned photoresist layer for forming the P type well region is complementary to that for forming the N type well region. In the present embodiment, the transparent pattern region in the mask 207 at the low voltage device region 201b is a reverse tone of the transparent pattern region in the mask 215 at the low voltage device region 201b. However, in the high voltage device region 201a, the isolation region 221 is located between the doped region 204a and the doped regions 212a so that it is necessary to change the transparent region pattern in the mask 207 and the mask 215 at the high voltage device region 201a.

Figure 3A:
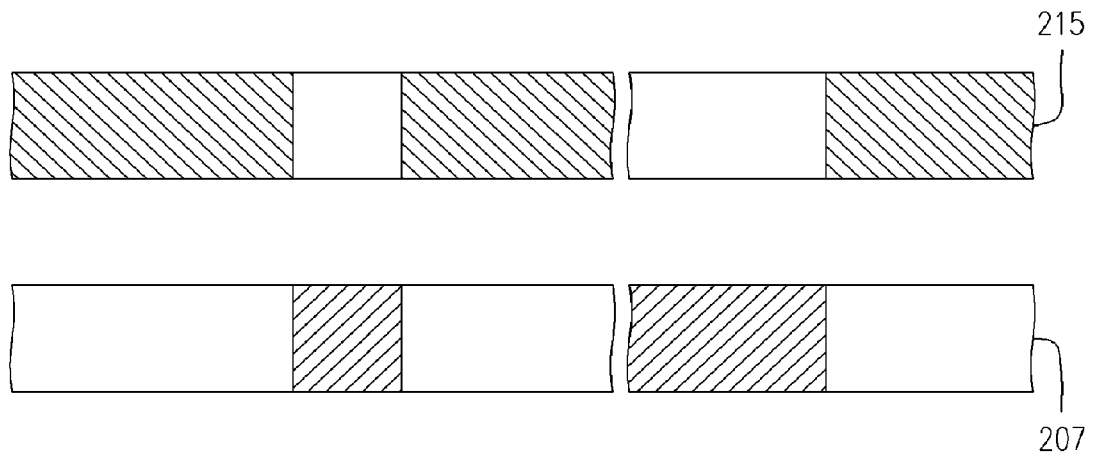
FIG. 3A is a schematic diagram showing a mask 207 and a mask 215 before a transparent region pattern of a high voltage device region 201a is changed.
Figure 3B:
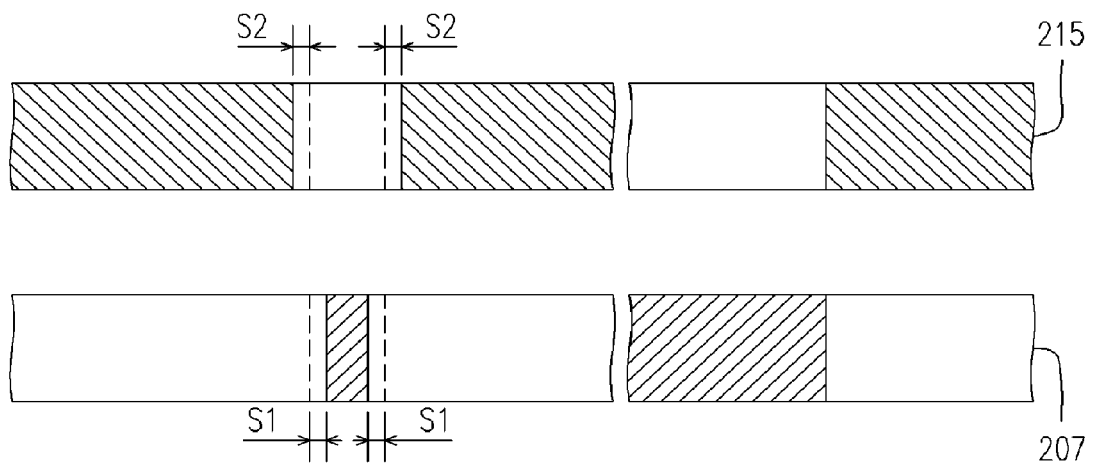
FIG. 3B is a schematic diagram showing the mask 207 and the mask 215 after the transparent region pattern of the high voltage device region 201a is changed.

FIG. 3A is a schematic diagram showing a mask 207 and a mask 215 before a transparent region pattern of a high voltage device region 201a is changed. FIG. 3B is a schematic diagram showing the mask 207 and the mask 215 after the transparent region pattern of the high voltage device region 201a is changed. The transparent region patterns in both FIG. 3A and FIG. 3B are denoted by twilled patterns. As shown in FIG. 3A, the transparent region pattern in the mask 215 is complementary to the transparent region pattern in the mask 207. Accordingly, while the mask 207 and the mask 215 are used in the process for forming the well regions, the well region 204b and the well region 212b formed in the low voltage device region 201b are adjacent to each other. Similarly, the doped region 204a and the doped regions 212a formed in the high voltage device region 201a are adjacent to each other. Hence, it is impossible to separate the doped region 204a from the doped regions 212a with the isolation region 221. Accordingly, during the pattern on the mask is designed, as shown in FIG. 3B, the fringe of the transparent region patterns on the mask 207 and on the mask 215 at the high voltage device region are inwardly shrunk with different shrinking values but the transparent region patterns on both of the mask 207 and the mask 215 at the low voltage device region remain unchanged. For example, the fringe of the transparent region pattern on the mask 207 at the high voltage device region is inwardly shrunk with a distance s1. Meanwhile, the fringe of the transparent region pattern on the mask 215 at the high voltage device region is inwardly shrunk with a distance s2. Therefore, the doped region 204a and the doped regions 212a formed in the high voltage device region 201a are separated from each other with a distance for forming the isolation region 221. The size of the isolation region 221 depends on the distance s1 and the distance s2. The designs of the masks are not limited by the above description. That is, the designs of the masks can be accomplished by only shrinking one of the fringes of the transparent region patterns on the mask 207 and the mask 215.

In the present invention, the doped regions at the high voltage device region and the well regions at the low voltage device region can be formed jointly. Therefore, the cost is decreased and the cycle time is decreased as well. Furthermore, the design of the mask and the photolithography process procedures are simplified so as to increase the production yield. Additionally, by controlling the size of the isolation region 221, which can be done by adjusting the distance d1 between the doped region 204a and the doped regions 212a, the breakdown voltage can be well controlled to meet the requirement.

Figure 4A:
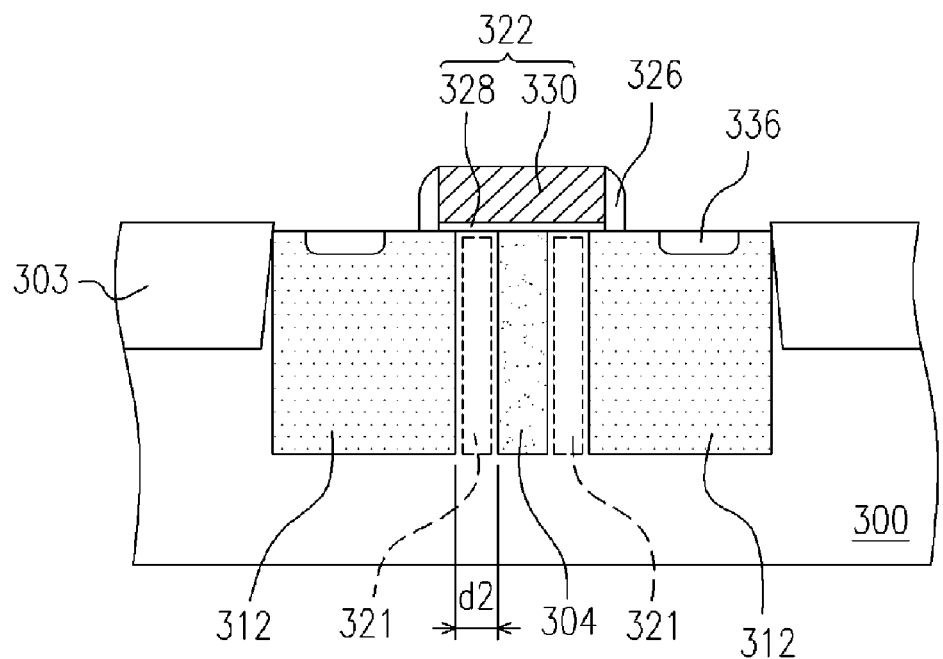
FIGS. 4A though 4B are cross-sectional views schematically showing high voltage devices according to one embodiment of the present invention respectively.

FIGS. 4A though 4B are cross-sectional views schematically showing high voltage devices according to one embodiment of the present invention respectively.

As shown in FIG. 4A, a high voltage device of the present invention is formed on a substrate 300. The high voltage device comprises several isolation structures 303, doped region 304, at least two doped region 312, an isolation region 321, a gate structure 322 and a source/drain region 336.

The isolation structures 303 are located in the substrate 300. The isolation structures 303 can be, for example but not limited to, a shallow trench isolation structure made of, for example, silicon oxide.

Moreover, the doped region 304 is located in the substrate 300 between the isolation structures 303. The doped region 304 can be, for example but not limited to, a P type doped region or an N type doped region. The doped regions 312 are located in the substrate 300 adjacent to both sides of the doped region 304. The doped regions 312 can be, for example but not limited to, an N type doped region or a P type doped region. That is, the conductive type of the doped region 304 is different from that of the doped regions 312. Also, a distance d2 between the doped region 304 and one of the doped regions 312 is about 0.1-3 micrometers. Preferably, the distance d2 is about 0.5 micrometers. In addition, the isolation region 321 is located in the substrate 300 between the doped region 304 and the doped regions 312. The distance d2 between the doped region 304 and the doped regions 312 determines the size of the isolation region 321 and further determines the breakdown voltage of the high voltage device.

The gate structure 322 is located on the substrate 300 between the doped regions 312. The gate structure 322 comprises a gate dielectric layer 328 and a gate electrode 330. The gate dielectric layer 328 can be, for example, made of silicon oxide. The gate electrode 330 can be, for example, made of doped polysilicon. The source/drain region 336 is located in the substrate 300 adjacent to both sides of the gate structure 322. The conductive type of the source/drain region 336 is as same as that of the doped regions 312. Furthermore, a spacer 326 can be formed on the sidewalls of the gate structures 322, 224a and 224b according to the process requirements. The spacer 326 can be, for example, made of silicon nitride.

Figure 4B:
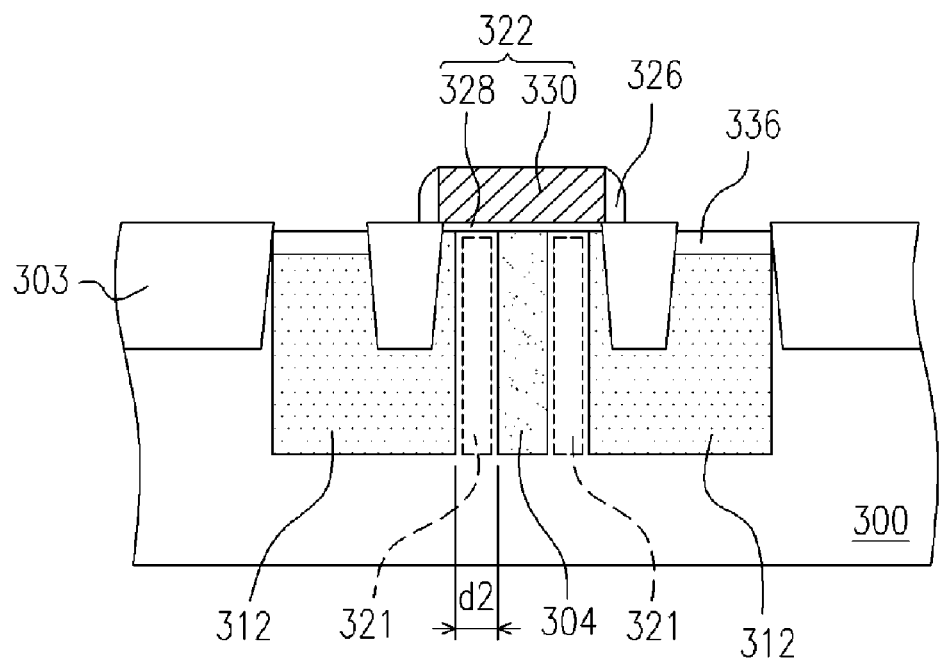

As shown in FIG. 4B, the elements are labeled with the reference number as same as that used to label the same elements shown in FIG. 4A and are not described herein. As shown in FIG. 4B, the gate structure 322 is located on the substrate 300 between the isolation structures 303. The source/drain region 336 is located in the substrate 300 and separated from the gate structure 322 with the isolation structures 303.

In the present invention, the doped regions mentioned above can be used to replace the grade region and drift region used in the conventional manufacturing process for the high voltage device. Further, the distance between the doped regions can be used to control the breakdown voltage of the source/drain region. Hence, manufacturing the devices respectively with different specifications respectively can be accomplished so as to full fill the requirements for manufacturing devices respectively with different breakdown voltages.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a high voltage device, comprising:
   providing a substrate;
   forming a first doped region having a first conductive type in the substrate;
   forming at least two second doped regions having a second conductive type in the substrate, wherein the second doped regions are located adjacent to both sides of the first doped region respectively, and the first doped region is separated from the second doped regions with an isolation region;
   forming a gate structure on the substrate between the second doped regions; and
   forming a source/drain region having the second doped region in the substrate adjacent to both sides of the gate structure.

2. The method of claim 1, wherein a distance between the first doped region and one of the second doped regions is about 0.1-3 micrometers.

3. The method of claim 1, wherein a distance between the first doped region and one of the second doped regions is about 0.5 micrometers.

4. The method of claim 1, wherein the steps of forming the first doped region and the second doped regions comprises:
   forming a first photoresist layer over the substrate;
   exposing the first photoresist layer with a first mask, wherein the first mask possesses a first transparent region pattern;
   developing the first photoresist layer to transform the first photoresist layer to be a patterned first photoresist layer;
   performing a first doping process to form the first doped region by using the patterned first photoresist layer as a mask;
   removing the patterned first photoresist layer;
   forming a second photoresist layer over the substrate;
   exposing the second photoresist layer with a second mask having a second transparent region pattern, wherein the second transparent region pattern is a reverse tone pattern of the first transparent region pattern;
   developing the second photoresist layer to transform the second photoresist layer to be a patterned second photoresist layer;
   performing a second doping process to form the second doped regions by using the patterned second photoresist layer as a mask; and
   removing the patterned second photoresist layer.

5. The method of claim 4, wherein the fringe of the first transparent region pattern is inwardly shrunk with a first distance and the fringe of the second transparent region pattern is inwardly shrunk with a second distance.

6. The method of claim 1, wherein a plurality of isolation structures are further formed in the substrate and the gate structure is located between the isolation structures and the source/drain region is separated from the gate structure by the isolation structures.

7. The method of claim 1, wherein when the fist conductive type is P type, the second conductive type is N type.

8. The method of claim 1, wherein when the fist conductive type is N type, the second conductive type is P type.

9. A method for manufacturing a semiconductor device, comprising:
   providing a substrate, wherein the substrate is divided into a high voltage device region and a low voltage device region;
   forming a first well region having a first conductive type in the low voltage device region and a first doped region having the first conductive type in the high voltage device region in the substrate;
   forming a second well region having a second conductive type in the low voltage device region and at least two second doped regions having the second conductive type in the high voltage device region in the substrate, wherein the second well region and the first well region are adjacent to each other in the low voltage device region, second doped regions are located at both sides of the first doped region in the high voltage device region in the substrate and the first doped region and the second doped regions are separated from each other by an isolation region;
   forming a gate structure on the substrate between the second doped regions in the high voltage device region; and
   forming a first source/drain region having the second conductive type in the substrate adjacent to both sides of the gate substrate.

10. The method of claim 9, wherein a distance between the first doped region and one of the second doped regions is about 0.1-3 micrometers.

11. The method of claim 9, wherein a distance between the first doped region and one of the second doped regions is about 0.5 micrometers.

12. The method of claim 9, wherein the step of forming the first well region in the low voltage device region and the first doped region in the high voltage device region comprises:
   forming a first photoresist layer over the substrate;
   exposing the first photoresist layer with a first mask, wherein the first mask possesses a first transparent region pattern;
   developing the first photoresist layer to transform the first photoresist layer to be a patterned first photoresist layer;
   performing a first doping process to form the first well region in the low voltage device region and the first doped region in the high voltage device region by using the patterned first photoresist layer as a mask; and
   removing the patterned first photoresist layer.

13. The method of claim 12, wherein the step of forming the second well region in the low voltage device region and the second doped regions in the high voltage device region comprises:
   forming a second photoresist layer over the substrate;
   exposing the second photoresist layer with a second mask having a second transparent region pattern, wherein the second transparent region pattern is a reverse tone pattern of the first transparent region pattern;
   developing the second photoresist layer to transform the second photoresist layer to be a patterned second photoresist layer;
   performing a second doping process to form the second well region in the low voltage device region and the second doped regions in the high voltage device region by using the patterned second photoresist layer as a mask; and
   removing the patterned second photoresist layer.

14. The method of claim 13, wherein the fringe of the first transparent region pattern in the high voltage device region is inwardly shrunk with a first distance.

15. The method of claim 13, wherein the fringe of the second transparent region pattern in the high voltage device region is inwardly shrunk with a second distance.

16. The method of claim 9, wherein a plurality of isolation structures are further formed in the substrate and, in the high voltage device region, the gate structure is located between the isolation structures and the source/drain region is separated from the gate structure by the isolation structures.

17. The method of claim 9, wherein when the fist conductive type is P type, the second conductive type is N type.

18. The method of claim 9, wherein when the fist conductive type is N type, the second conductive type is P type.

19. The method of claim 9 further comprising:

forming a first gate structure on the first well region;

forming a second source/drain region having the second conductive type in the substrate adjacent to both sides of the first gate structure;

forming a second gate structure on the second well region; and forming a third source/drain region having the first conductive type in the substrate adjacent to both sides of the second gate structure.

* * * * *